(12) United States Patent
Bayan

(10) Patent No.: US 7,619,303 B2
(45) Date of Patent: Nov. 17, 2009

(54) INTEGRATED CIRCUIT PACKAGE

(75) Inventor: Jaime A. Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 77 days.

(21) Appl. No.: 11/961,798

(22) Filed: Dec. 20, 2007

(65) Prior Publication Data
US 2009/0160067 A1      Jun. 25, 2009

(51) Int. Cl.
| | |
|---|---|
| H01L 23/495 | (2006.01) |
| H01L 23/02 | (2006.01) |
| H01L 23/34 | (2006.01) |
| H01L 23/52 | (2006.01) |
| H01L 23/48 | (2006.01) |
| H01L 23/40 | (2006.01) |

(52) U.S. Cl. .................. 257/666; 257/673; 257/678; 257/723; 257/777; 257/E23.039; 257/E23.043; 257/E23.045

(58) Field of Classification Search ............... 257/666, 257/673, 678, 723, 777, E23.039, E23.043, 257/E23.045
See application file for complete search history.

(56) References Cited

U.S. PATENT DOCUMENTS

| | | | |
|---|---|---|---|
| 5,596,225 A | 1/1997 | Mathew et al. | |
| 5,677,567 A * | 10/1997 | Ma et al. ................. | 257/666 |
| 6,080,264 A * | 6/2000 | Ball ........................ | 156/292 |
| 6,184,573 B1 * | 2/2001 | Pu .......................... | 257/666 |
| 6,204,554 B1 | 3/2001 | Ewer et al. | |
| 6,353,257 B1 | 3/2002 | Huang | |
| 6,388,336 B1 * | 5/2002 | Venkateshwaran et al. .. | 257/779 |
| 6,424,024 B1 | 7/2002 | Shih et al. | |
| 6,518,161 B1 | 2/2003 | Rajagopalan et al. | |
| 6,577,012 B1 | 6/2003 | Greenwood et al. | |
| 6,593,545 B1 | 7/2003 | Greenwood et al. | |
| 6,700,189 B2 | 3/2004 | Shibata et al. | |
| 6,750,546 B1 | 6/2004 | Villanueva et al. | |
| 6,798,044 B2 * | 9/2004 | Joshi ....................... | 257/666 |
| 6,927,483 B1 | 8/2005 | Lee et al. | |
| 6,953,988 B2 | 10/2005 | Seo et al. | |

(Continued)

OTHER PUBLICATIONS

Office Action in U.S. Appl. No. 11/936,017, dated Apr. 3, 2009.

(Continued)

Primary Examiner—Luan C Thai
(74) Attorney, Agent, or Firm—Beyer Law Group LLP

(57) ABSTRACT

An integrated circuit package is described that includes two dice. The active surface of each die includes a plurality of I/O pads. The active surface of the first die is positioned adjacent first surfaces of the leads of a lead frame such that I/O pads from the first die are arranged adjacent corresponding solder pad surfaces on the first surfaces. Similarly, the active surface of the second die is positioned adjacent second surfaces of the leads opposite the first surfaces such that I/O pads from the second die are arranged adjacent corresponding solder pad surfaces on the second surfaces. A plurality of solder joints are arranged to physically and electrically connect I/O pads from the first or second die to associated adjacent solder pad surfaces on the leads. In this way, a single lead frame can be utilized to package two dice, one on either side of the leads of the leadframe.

24 Claims, 9 Drawing Sheets

U.S. PATENT DOCUMENTS

| | | |
|---|---|---|
| 7,067,904 B2 | 6/2006 | Wang et al. |
| 7,164,202 B2 | 1/2007 | Wang et al. |
| 7,250,685 B2 | 7/2007 | Shim et al. |
| 7,253,508 B2 | 8/2007 | Liu et al. |
| 2002/0093093 A1* | 7/2002 | Paek ......................... 257/723 |
| 2003/0071344 A1 | 4/2003 | Matsuzawa et al. |
| 2003/0155634 A1 | 8/2003 | Yasunaga et al. |
| 2005/0156296 A1 | 7/2005 | Wang et al. |
| 2005/0167855 A1 | 8/2005 | Minamio et al. |
| 2005/0224945 A1* | 10/2005 | Saito et al. .................. 257/686 |
| 2006/0105501 A1 | 5/2006 | Kuah et al. |

OTHER PUBLICATIONS

U.S. Appl. No. 11/691,429, filed Mar. 26, 2007.
Office Action in U.S. Appl. No. 11/691,429, dated Nov. 28, 2008.
Final Office Action in U.S. Appl. No. 11/691,429, dated Jun. 1, 2009.
U.S. Appl. No. 11/936,017, filed Nov. 6, 2007.
Office Action dated Oct. 1, 2009 in U.S. Appl. No. 11/691,429.

* cited by examiner

INTEGRATED CIRCUIT PACKAGE

TECHNICAL FIELD

The present invention relates generally to the packaging of integrated circuits (ICs). More particularly, an IC package is described that includes two IC dice.

BACKGROUND OF THE INVENTION

There are a number of conventional processes for packaging integrated circuit (IC) dice. By way of example, many IC packages utilize a metallic lead frame that has been stamped or etched from a metal sheet to provide electrical interconnects to external devices. The die may be electrically connected to the lead frame by means of bonding wires, solder bumps, or other suitable electrical connections. In general, the die and portions of the lead frame are encapsulated with a molding material to protect the delicate electrical components on the active side of the die while leaving selected portions of the lead frame exposed to facilitate electrical connection to external devices.

In some applications, it is desirable to leave the back surface (opposite the active surface) of the die exposed; that is, not to encapsulate the back surface of the die with molding material. By way of example, it may be desirable to leave the back surface of the die exposed in order to increase heat dissipation out of the die. This is especially relevant for packages used in power applications. Increasing heat dissipation out of an IC die generally results in greater device performance and stability.

While existing arrangements and methods for packaging IC devices work well, there are continuing efforts to improve the thermal performance of IC devices.

SUMMARY OF THE INVENTION

In one aspect, an integrated circuit package is described that includes two dice. The active surface of each die includes a plurality of I/O pads. The active surface of the first die is positioned adjacent first surfaces of the leads of a leadframe such that I/O pads from the first die are arranged adjacent corresponding solder pad surfaces on the first surfaces. Similarly, the active surface of the second die is positioned adjacent second surfaces of the leads opposite the first surfaces such that I/O pads from the second die are arranged adjacent corresponding solder pad surfaces on the second surfaces. A plurality of solder joints are arranged to physically and electrically connect I/O pads from the first or second die to associated adjacent solder pad surfaces on the leads. In this way, a single leadframe can be utilized to package two dice, one on either side of the leads of the leadframe.

In various embodiments, the package also includes a molding material that encapsulates portions of the dice, leads and solder joints. In some embodiments, the back surface of the first die is left uncovered by molding material and has an exposed metallic layer deposited thereon. The back surface of the second die may also be left uncovered by molding material and may also have an exposed metallic layer deposited thereon.

In various embodiments, the package is intended to be mounted to a printed circuit board. The printed circuit board includes a plurality of contact surfaces. A plurality of solder joints physically and electrically connect bottom surfaces of the leads with associated contact surfaces on the printed circuit board. Additionally, a solder joint may also be used to connect the exposed metallic layer on the back of the first die to an associated contact surface on the printed circuit board. In some embodiments, a heat sink may be soldered to the metallic layer on the back surface of the second die. The heat sink may also be soldered to a surface of the printed circuit board to further facilitate heat transfer out of the package. As will be appreciated, the described arrangement is particularly useful in power applications.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF EXAMPLE EMBODIMENTS

The present invention relates generally to the packaging of integrated circuits (ICs). More particularly, an IC package is described that includes two IC dice.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Various embodiments of the present invention will be described with reference to FIGS. 1-2. Aspects of the present invention provide an IC package that utilizes a leadframe in the packaging of at least two IC dice. The I/O pads on the active surfaces of the dice are physically and electrically connected with associated leads of the leadframe with solder joints. In some embodiments, the dice are packaged such that an exposed metallic layer deposited onto the back surface of at least one of the dice remains uncovered by molding compound used to encapsulate other portions of the dice, leads and solder joints.

Figure 1A:
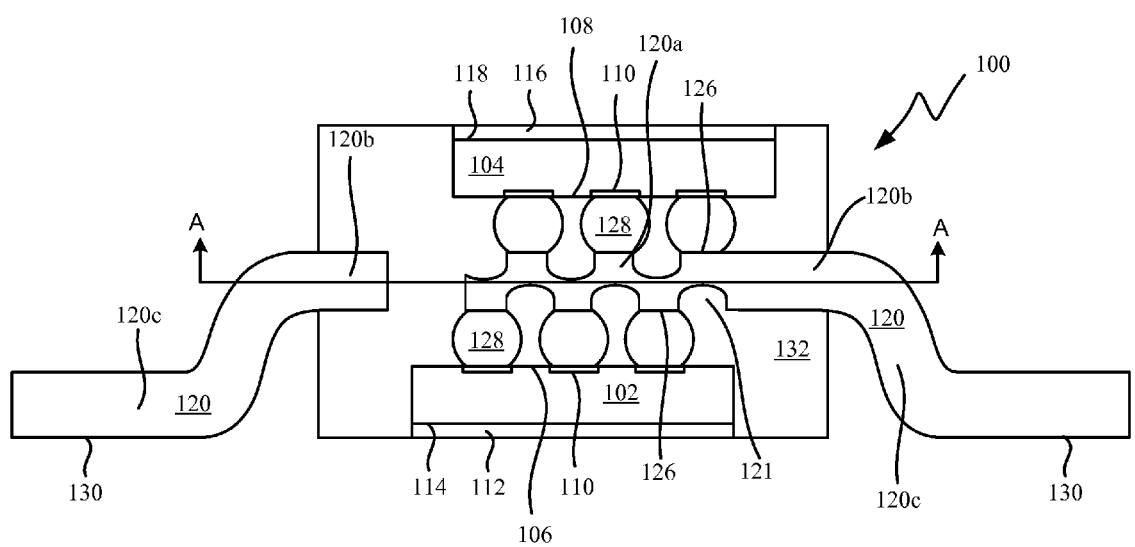
FIGS. 1A-D illustrate diagrammatic first cross-sectional side, second cross-sectional side, cross-sectional top and bottom views, respectively, of an IC package in accordance with an embodiment of the present invention.
Figure 1B:
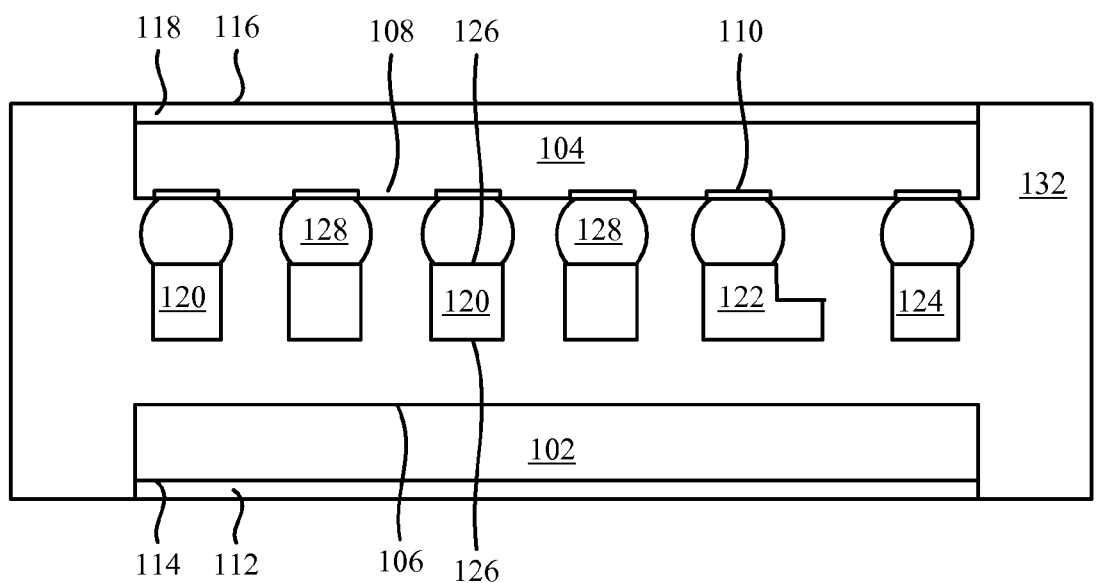
Figure 1C:
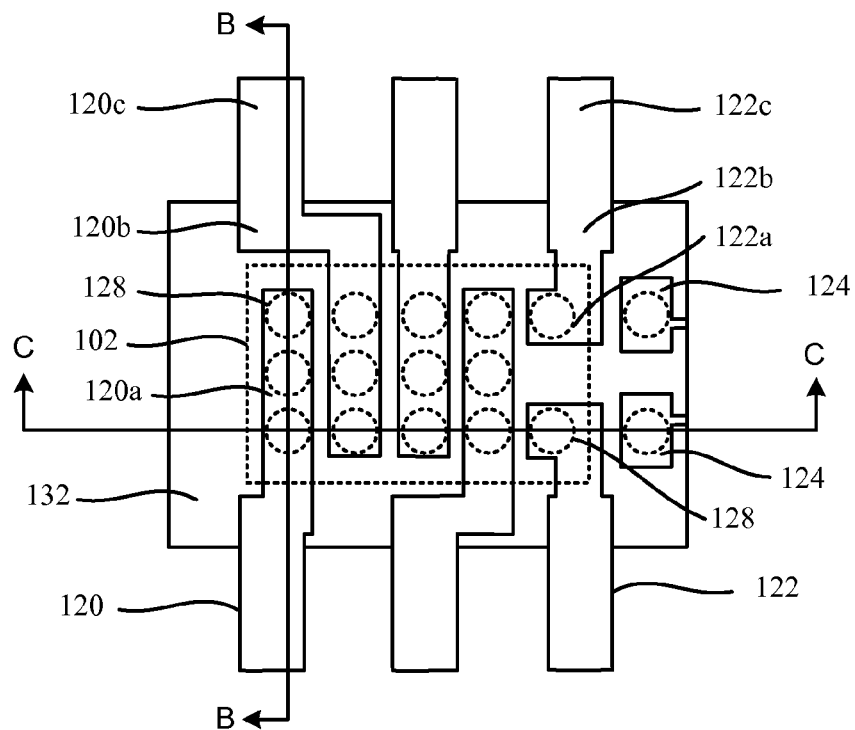

Referring initially to FIGS. 1A-1D, an IC package 100 is described. IC package 100 is particularly suitable for use in power applications. Generally, package 100 may be referred to as a flip-chip-on-lead (FCOL) type package. FIGS. 1A and 1B illustrate cross-sectional side views of package 100 taken along lines B-B and C-C, respectively, shown in FIG. 1C, which illustrates a cross-sectional top view of package 100 taken along line A-A of FIG. 1A. IC package 100 includes a first bottom IC die 102 and a second top IC die 104. In some embodiments, both of the dice 102 and 104 may be configured for use in power applications.

The first bottom die 102 and second top die 104 have active surfaces 106 and 108, respectively. The active surfaces 106 and 108 are arranged so as to face one another and each include a plurality of bond pads 110 (although the die 102 would be hidden from view, the perimeters of the die 102 and bond pads 110 associated with the die 102 are illustrated with a dotted line in FIG. 1C). In some particular embodiments, the active surfaces 106 and 108 are mirror images of one another. More specifically, if the active surface 108 of the second top die 104 is positioned over and adjacent the active surface 106 of the first bottom die 102, the bond pads 110 on the active surface 108 of the top die 104 may align with corresponding similar functioning bond pads 110 on the active surface 106 of the bottom die 102. The bond pads 110 may be the original bond pads on the active surface of the die 102 or other input/output (I/O) pads that have been redistributed from the bond pads using various redistribution techniques (hereinafter, bond pads will be used interchangeably with I/O pads). Additionally, in various embodiments, underbump metallizations (UBMs) may be formed on the bond pads 110 of the dice 102 and 104 prior to solder bumping.

Figure 1D:
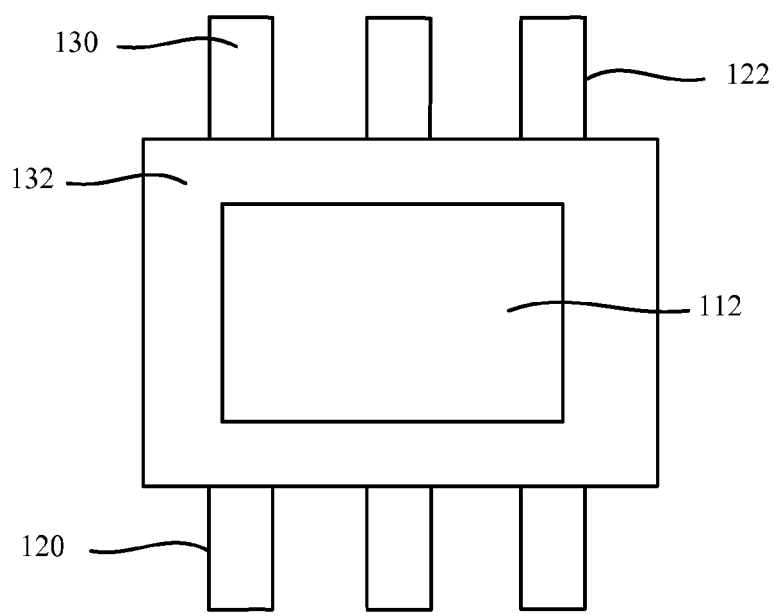

In various embodiments, the bottom IC die 102 includes a thin metallic layer 112 deposited onto the back surface 114 of the die as best illustrated in FIG. 1D, which illustrates the bottom surface of the package 100. The thin metallic layer 112 may be formed from any suitable metal or metallic alloy. By way of example, the thin metallic layer 112 may be an alloy of titanium, nickel and silver. The thin metallic layer 112 may also be applied to the back surface 114 of the die 102 with any suitable means including, for example, sputtering. The metallic layer 112 may serve as a heat dissipation medium for transferring thermal energy out of the die 102. In various embodiments, the back surface 114 of the die 102 is intended to be soldered directly to a desired substrate, such as a PCB, to provide for enhanced heat dissipation out of the die. Since solder does not generally adhere well to Si, the metallic layer may serve as an intermediary between the solder and the Si. In other embodiments, such as in analog applications, it is desirable to electrically connect the back surface 114 of the die 102 to a PCB to allow control over the electrical potential of the back region of the die. In some embodiments, a similar thin metallic layer 116 is also deposited onto the back surface 118 of the top die 104.

Package 100 additionally includes a leadframe having a plurality of leads 120. Each lead 120 may be configured as a power lead intended for coupling to an external power or ground line. By way of example, power leads 120 may be configured to carry at least approximately 1 Watt. In other applications, each power lead 120 may be configured to carry much higher powers. Each lead 120 includes an inner lead finger portion 120a, a middle lead portion 120b and an outer lead portion 120c. In various embodiments, the leads 120 are arranged such that the inner lead finger portions 120a are arranged in interlaced adjacent rows over the active surface 106 of the first bottom die 102. More specifically, the leads 120 may be arranged such that the middle portion 120b and outer portion 120c of each lead 120 is positioned on an opposite side of the die 102 as the middle and outer lead portions of the leads 120 immediately adjacent to the respective lead.

In the embodiment illustrated in FIGS. 1A-D, which illustrate a dual inline package (DIP) format, four leads 120 are configured such that the four associated inner lead finger portions 120a are arranged in four interlaced rows over the active surface 106 of the bottom die 102. The outer portions 120c of the corresponding leads 120 are arranged such that two of the outer portions 120c of the leads 120 extend from each of two opposite sides of the package 100.

Furthermore, a number of signal leads 122 may be provided in addition to the power leads 120. For example, in the illustrated embodiment, two signal leads 122 are provided. The illustrated leads are arranged on opposite sides of one end of the package 100. In other embodiments, package 100 may include only one signal lead 122, while in still other embodiments, package 100 may include more than two signal leads 122. Leads 122 are generally intended for connection to signal or control lines and any suitable number of signal leads 122 may be present in package 100. The associated inner regions 122a of the leads 122 may be positioned in a single row over the active surface 106 of the bottom die 102 as illustrated in FIG. 1C. The outer portions 122c of the leads 122 are arranged to extend from opposite sides of the package 100. The described arrangement forms a DIP 100 having five rows of leads over the active surface 106 of the die 102 and six corresponding external outer lead portions 120c and 122c, three of which (two outer portions 120c and one outer portion 122c) extend from each of two opposite sides of the package 100.

Package 100 may also include a number of additional internal leads 124. Internal leads 124 may be used to connect associated bond pads 110 on the active surfaces 106 and 108 of the two dice 102 and 104 with one another. In the illustrated embodiment, the internal leads 124 do not extend out of the package 100. The leads 124 enable the dice 102 and 104 to communicate with one another. By way of example, in one embodiment, one of the dice 102 or 104 may serve as a master chip that regulates the operations of the other die. In one alternate embodiment, bond pads 110 on each of the respective dice 102 and 104 may be connected with one another with larger solder joints that span the gap between associated bond pads 110 on each of the respective dice thereby eliminating the need for the leads 124.

Each of the inner lead portions 120a and 122a and the internal leads 124 includes at least one conductive solder pad 126. The inner lead portions 120a and 122a are arranged such that the solder pads 126 are positioned adjacent corresponding bond pads 110 on the active surfaces 106 and 108 of the dice 102 and 104, respectively. Each bond pad 110 is physically and electrically connected to one of the associated leads 120, 122 or 124 with a solder ball joint 128. In various embodiments, the outer portions 120c and 122c of the leads 120 and 122 additionally include package contacts 130 on the bottom surfaces of the leads. In some embodiments, the leads 120, 122 and 124 may be etched, half-etched, or otherwise thinned relative to the solder pads 126 and/or package contacts 130 as will be described in more detail below.

It many embodiments, a single lead 120 or 122 may be electrically and physically connected with one or more bond pads 110 on each of the dice 102 and 104, as illustrated in FIGS. 1A and B. This leadframe arrangement especially facilitates the packaging of dice 102 and 104 whose respective active surface 106 and 108 and associated bond pads 110 are mirror images of one another. More specifically, a single lead 120 or 122 may be used to bias bond pads 110 on both dice 102 and 104 simultaneously.

In various embodiments, one or more leads 120 are each connected with multiple I/O pads 110 on each of the active surfaces 106 and 108 of the dice 102 and 104. By way of example, a single inner lead finger 120a may include multiple solder pads 126, each of which is to be physically and electrically bonded to one of multiple I/O pads 110 designated for connection with power or ground lines, which typically carry higher current and power. The number of I/O pads 110 connected with each lead 120 may vary widely. By way of example, anywhere from 1 to 8 I/O pads 110 on each die 102 and 104 may be connected with corresponding solder pads 126 on a single lead 120. In some high power applications, an even greater number of I/O pads may be connected with a single lead 120. In the embodiment illustrated in FIGS. 1A-D, the leads 120 that are intended for connection to higher current power or ground lines and are each connected with three corresponding I/O pads 110 on each of the top and bottom dice 104 and 102. In contrast, the leads 122 are generally intended for connection to signal or control lines and are each connected with a single I/O pad 110 on each of the top and bottom dice 104 and 102 via a single solder joint 128.

In some embodiments, the leads may be etched to form recessed regions 121 around the solder pads 126 on both sides of the leads 120 in order to prevent the spread of solder between adjacent solder pads 126 and along other surfaces of each lead. The recessed regions 121 essentially form a moat around each solder pad 126 that serves to isolate the solder pad from the rest of the associated lead surfaces. The recessed regions 121 may be formed by any suitable means. By way of example, the recessed regions 121 may be formed by etching the top surface of the lead frame panel. The formation and use of recessed regions to isolate solder pads is described in more detail in U.S. patent application Ser. No. 11/691,429, which is incorporated by reference herein.

Each recessed region 121 is recessed sufficiently from the surface of the solder pads of the associated leads to prevent flux and solder from spreading to undesired surfaces of the lead 120. More particularly, the recessed regions 121 are preferably etched sufficiently deep such that the spread of flux or solder is limited to the solder pads 126 by the surface tension of the flux or solder, respectively. By way of example, the recessed regions 121 are preferably recessed to a depth in the range of approximately 2 to 4 mils in typical lead frame designs although deeper or shallower recessed regions may be provided. In one preferred embodiment the recessed regions on both sides of the leads are half-etched simultaneously thus saving valuable processing time. The aforementioned recess depths work well for a variety of solder pad geometries and sizes.

It should be appreciated that the resulting "raised" solder pads limit the spread of solder since (a) they tend to define the areas cleaned by flux, and (b) the surface tension of the solder tends to further help prevent the solder from extending beyond the edges of the solder pads 212.

In one embodiment, the recessed regions 121 are etched such that the solder pads 126 are substantially circular. In an alternate embodiment, the solder pads 126 may be substantially oval, rectangular or square (with or without rounded corners). However, in many applications it is preferable to have substantially circular solder pads rather than rectangular solder pads or other solder pads having geometries with sharp corners. More particularly, sharp corners may have the effect of counteracting the forces of surface tension that confine the flux and solder to the surfaces of the solder pads 126. Additionally, in some applications it will be desirable to form solder pads 126 wider than other portions of their associated leads 208.

The recessed regions 121 preferably extend to a sufficient length along the leads so that the flux may not bridge the recessed regions between the solder pads 126 and the rest of the leads. Additionally, in some embodiments it may be desirable for the recessed regions 121 to extend to a greater length.

It should be appreciated that the solder pads 126 defined by the recessed regions 121 may also be advantageously used to control the standoff height between the leads and an associated die. The standoff height between the leadframe (e.g., solder pad 126) and the die (e.g., I/O pad 110) is generally a function of the volume of solder in the solder bump 128 as well as the surface area and geometry of the associated UBM (or I/O pad 110) and solder pad 126. Therefore, by controlling the volume of solder as well as the surface areas and geometries of the solder pad 126 and I/O pad 110, a desired standoff height may be achieved. Furthermore, since the same process may be applied to every solder joint, a uniform standoff height may be achieved across the entire die.

In the embodiment illustrated in FIG. 1A, the dice 102 and 104 are offset from one another. The offset results from the staggering of the solder pads 126 on opposite sides of the leads. More particularly, the recessed regions 121 in FIG. 1A are half etched and as such, the solder pads 126 on both sides of the lead 120 may not overlie one another. In other embodiments, the recessed regions 121 may be recessed to a depth of less than halfway through the lead thereby allowing the solder pads 126 on both sides of the lead to directly overlie one another thereby permitting the dice to directly overlie one another.

As will be appreciated by those familiar with the art, power or ground lines generally carry higher current than other signal or control lines. The aforementioned arrangement allows the current through a single lead 120 to be shared by multiple associated I/O pads 110 on each of the top and bottom dice 104 and 102, and their associated solder ball joints 128. The amount of current carried by each solder joint 128 is limited in part by the size of the solder joint (e.g., the diameter of the solder joint). The diameter of the solder joint 128 is, in turn, generally limited by the size of the corresponding I/O pad 110, which is in turn limited by the available real estate on the active surfaces 106 and 108 of the dice 102 and 104. More particularly, for a given die footprint, the layout (distribution), size and shape of the I/O pads 110 is limited by the regions on the active surfaces of the dice available for bonding and the total area of the active surfaces of the dice as well as proximity constraints placed on the I/O pads.

Those familiar with the art will appreciate that the current carrying and heat dissipation capabilities of solder ball joints far exceed those of bonding wires. Generally, as the number and diameter of the solder ball joints 128 increase, the current carrying and heat dissipation capabilities increase. Additionally, as the diameters of the solder ball joints 128 increase, the resistance through the solder ball joints decreases. As a result of their larger diameters and the relatively shorter distance traveled through a solder ball joint as compared to a typical bonding wire, the electrical resistance through solder ball joints is far below that of typical bonding wires. By way of example, a typical solder ball joint may have a resistance of approximately 0.5 mΩ while a corresponding bonding wire used in a similar application may have a resistance in the range of approximately 60 to 100 mΩ.

It will be appreciated by those skilled in the art that, although a specific lead frame arrangement has been described and illustrated, embodiments of the present invention may utilize an extremely wide variety of other leadframe configurations as well. Additionally, although described with references to top and bottom dice and various surfaces, it should be appreciated that this context is intended solely for use in describing the structure and may not coincide with the final orientation of the package after subsequent attachment to a PCB or other suitable substrate.

In the illustrated embodiment, portions of the dice 102 and 104 and leads 120, 122 and 124 are encapsulated with a molding material or compound 132. The molding compound is generally a non-conductive plastic or resin having a low coefficient of thermal expansion. Package 100 may be encapsulated in such a way as to prevent molding material 132 from covering or intruding over the metallic layer 112 on the back surface 114 of the bottom die 102. Package 100 may also be encapsulated such that molding material is prevented from covering or intruding over a metallic layer 116 on the back surface 118 of the top die 104. The molding material does encapsulate other portions of the dice 102 and 104, the solder joints 128, leads 124 and generally at least the inner portions 120a and 122a and middle portions 120b and 122b of the leads 120 and 122, respectively. In the embodiment illustrated in FIGS. 1A-1D, the outer portions of the leads 120 and 122 extend from the sides of the encapsulated package 100 and are bent into a characteristic gull-wing formation to facilitate electrical connection with a printed circuit board (PCB) or other suitable substrate. Additionally, the package contacts 130 on the bottom surfaces of the leads 120 and 122 may be configured so as to be coplanar with the bottom or back surface of the metallic layer 112.

Figure 2A:
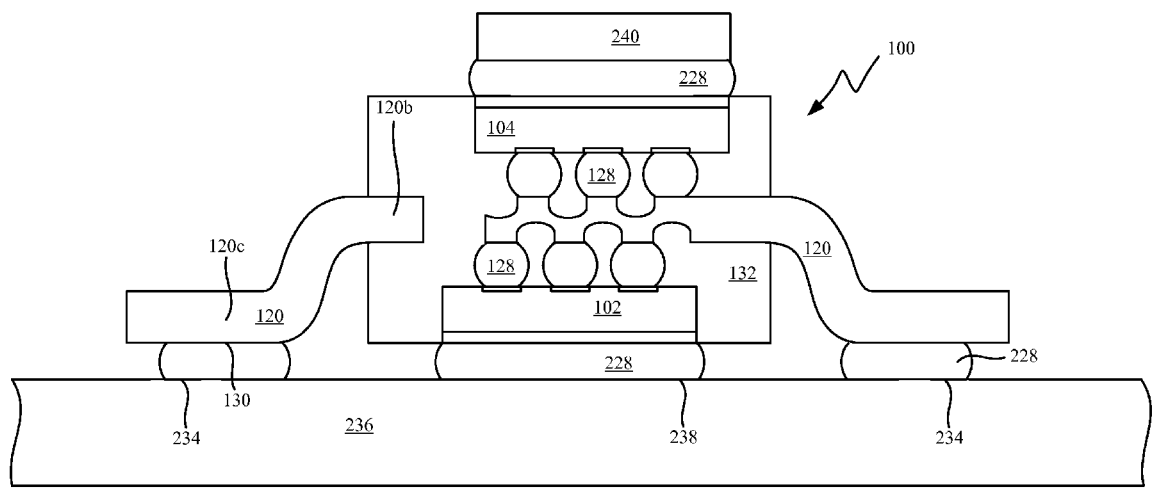
FIGS. 2A-B illustrate diagrammatic cross-sectional side views of the IC package of FIG. 1 mounted on a printed circuit board in accordance with an embodiment of the present invention.
Figure 2B:
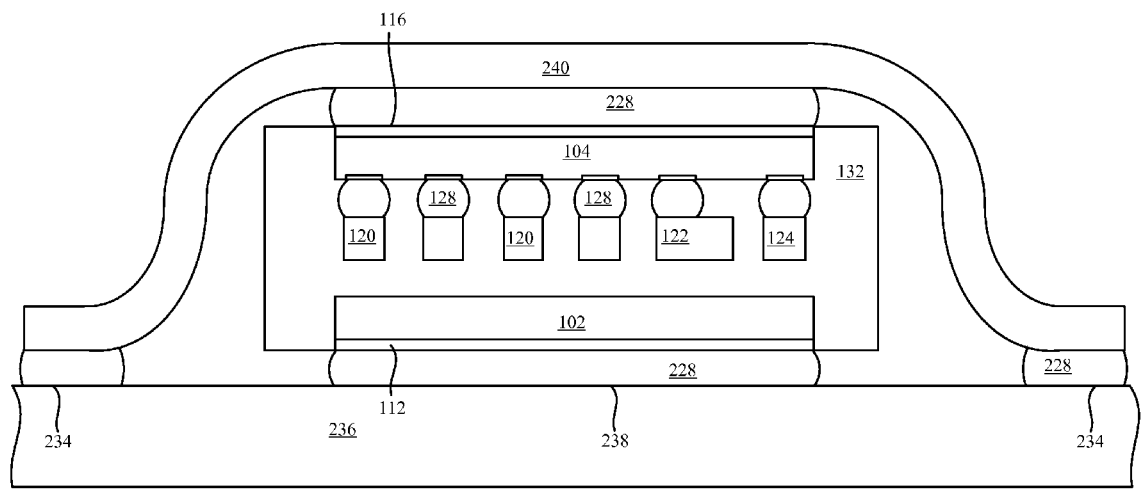

In the embodiment illustrated in FIGS. 2A and B, the package contacts 130 on the bottom surfaces of the leads 120 and 122 of package 100 are physically and electrically connected with corresponding contacts 234 on a PCB 236 via solder joints 228. In various embodiments, the metallic layer 112 is also physically and electrically connected to an associated contact surface 238 on the PCB 236. Additionally, in some embodiments, a heat sink 240 may be soldered to the metallic layer 116 on the top die 104. In the illustrated embodiment, the heat sink 240 is also soldered to corresponding contact surfaces 242 on the PCB 236. Although a specific heat sink 240 is illustrated, it will be appreciated that any suitable heat sink may be incorporated.

The described arrangement provides multiple efficient and direct mechanisms for dissipating heat out of the package 100. More particularly, by soldering or otherwise connecting the metallic layer 112 on the back surface 114 of the bottom die 102 to the PCB 236, a direct thermally conductive path is created between the die 102 and the PCB 236. Additionally, the heat sink 240 provides an efficient means for transferring heat out of the top of the package 100. Furthermore, as already described, the solder joints 128 also provide an efficient thermal path for dissipating thermal energy out of the package 100 via the leads 120 to the contacts 234 on the PCB 236. Thus, embodiments of the present invention provide three efficient means of dissipating heat out of the package 100.

Furthermore, the described arrangement of the dice 102 and 104 and leads 120, 122 and 124 enables the production of a package 100 having double the effective silicon density and hence potentially double the performance while maintaining a conventional package size. Conversely, one could retain a desired silicon density and performance while halving the footprint of the package. More specifically, by advantageously utilizing the volume in the top half of the package to incorporate a second die, the number of transistors for a given package footprint may be doubled. Moreover, by soldering the exposed metallic layer on the back surface of the bottom die to a PCB and/or soldering a heat sink to an exposed metallic layer on the back surface of the top die, the thermal performance of the package is increased sufficiently to enable the full utilization of both dice. Furthermore, in embodiments in which mirror image dice are used, no additional leads are required as each lead may be connected with corresponding I/O pads on both dice.

Figure 3A:
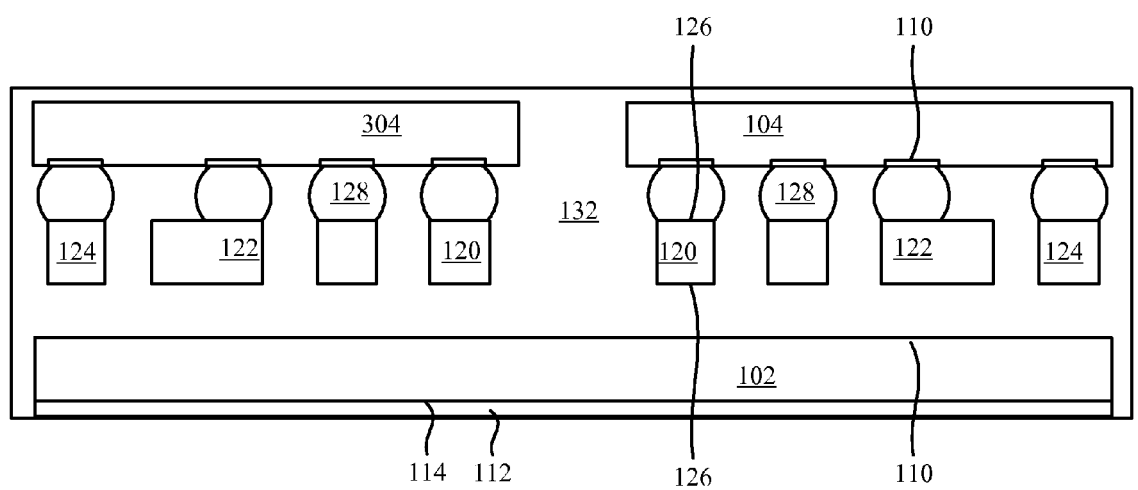
FIGS. 3A-B illustrate diagrammatic cross-sectional side and cross-sectional top views, respectively, of a three-die package in accordance with an embodiment of the present invention.
Figure 3B:
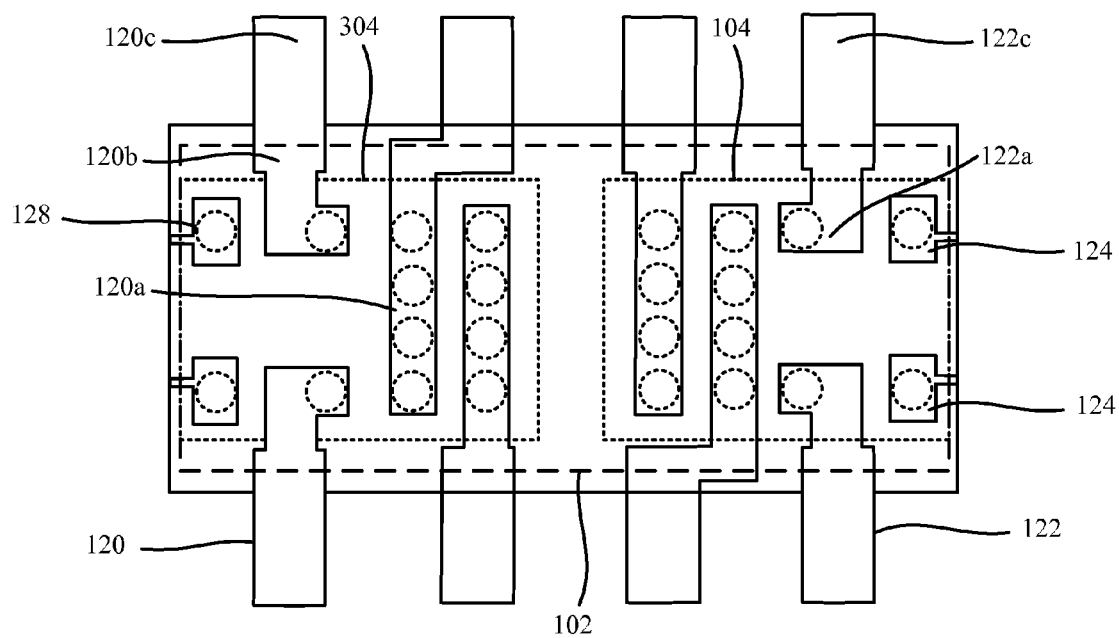

Although the embodiments described thus far have focused on the packaging of two IC dice, it will be appreciated that, in other embodiments, more than two dice may be packaged into a single IC package as well. By way of example, FIGS. 3A and 3B illustrate an alternative embodiment of a package 100 which includes two top dice 104 and 304. In the embodiment illustrated in FIG. 3B, the perimeter of the bottom die 102 is illustrated with a dashed line while the perimeters of the top dice 104 and 304 are each illustrated with dotted lines. In some embodiments, one or both of the top dice 104 and 304 may be utilized as a control chip for regulating operations in the bottom die 102. In these embodiments, bond pads 110 on one or both of the dice 104 and 304 may be connected with bond pads on the bottom die 102 via internal leads 124. Depending upon the application, the top dice 104 and 304 may or may not include exposed metallic layers on their respective back surfaces. In some embodiments, the top dice 104 and 304 may also be electrically connected with one another to permit electrical communication therebetween. As will be appreciated by those of skill in the art, the described arrangement facilitates the production of system-in-package (SIP) or multi-chip module (MCM) package designs. Furthermore, although only a single embodiment of a three-chip (die) package is illustrated, it will be appreciated that both the number and arrangement of the leads and dice may vary widely.

Figure 4:
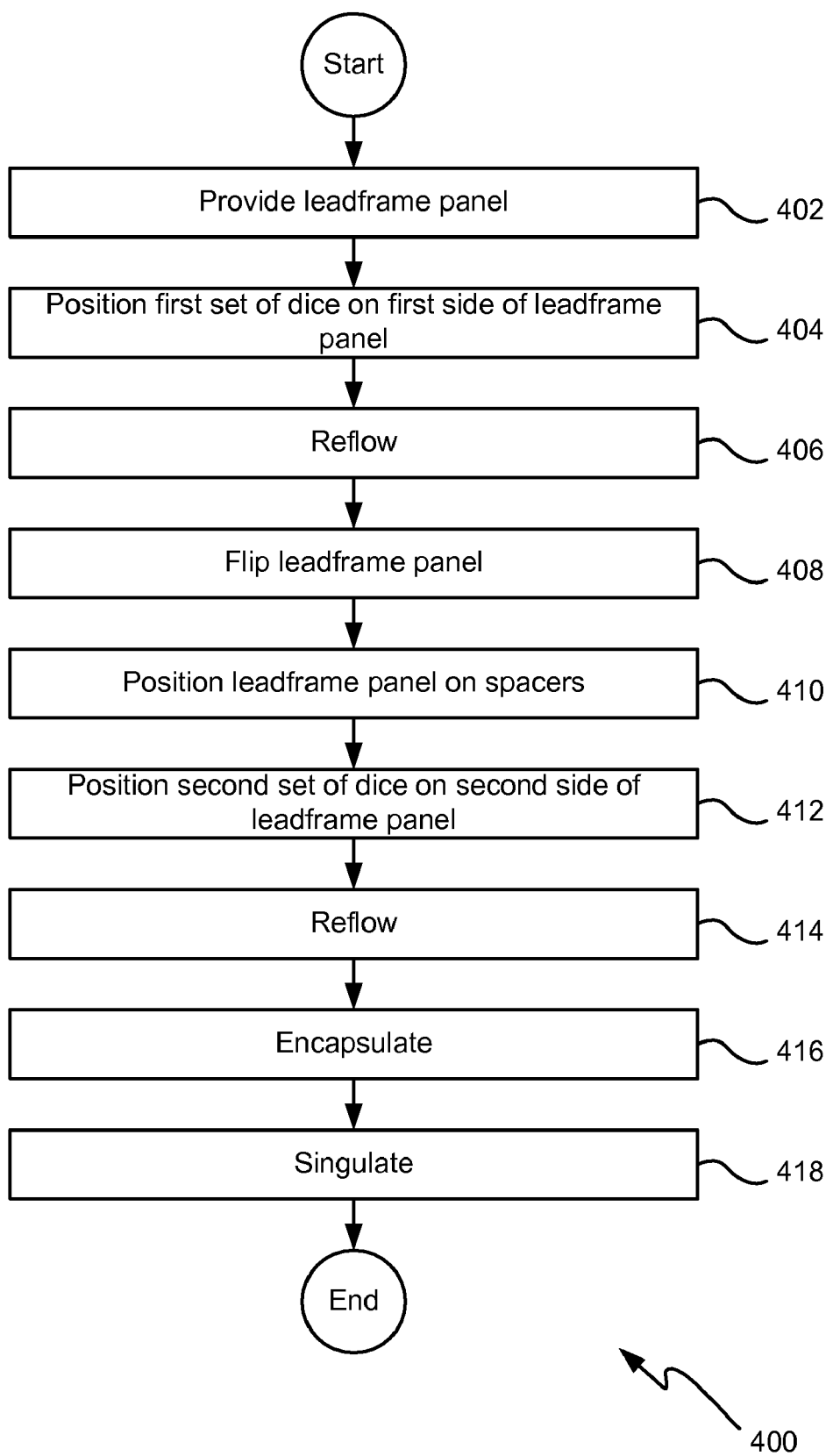
FIG. 4 is a flow chart illustrating a process of packaging integrated circuit dice in accordance with an embodiment of the present invention.
Figure 5:
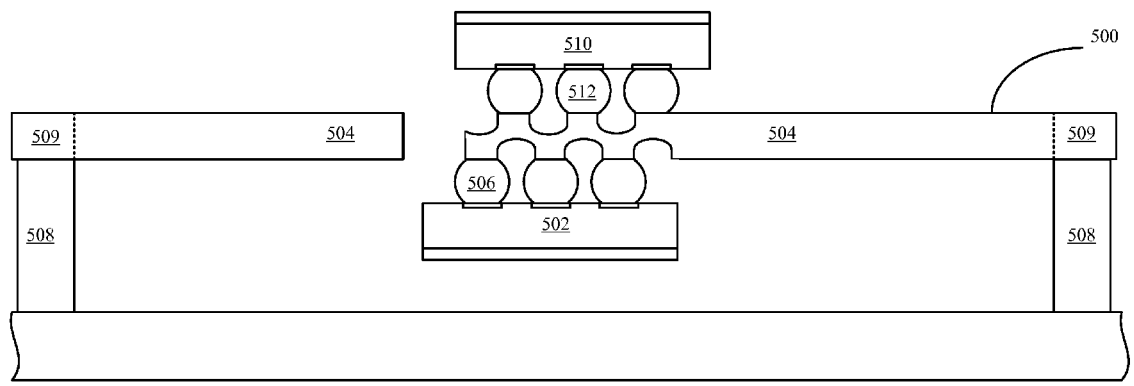
FIG. 5 illustrates an arrangement in which dice are mounted to each of two opposite sides of a leadframe.

With reference to FIGS. 4 and 5 a process 400 of packaging at least two integrated circuit dice with a single leadframe device area will be described. A leadframe such as those described above is provided at 402. At 404 a first die is positioned onto a first side of the leadframe. It will be appreciated that in various embodiments the leadframe is a single leadframe device area of a larger leadframe panel having a multitude of leadframe device areas each of which is suitable for use in packaging IC dice. By way of example, the leadframe panel may be in the form of a strip with side rails and other supporting structures supporting the device areas of the leadframe panel. In these embodiments, dice may be positioned on each device area of the leadframe panel. Additionally, in some embodiments, multiple dice may be positioned within a single device area (such as in the embodiment illustrated in FIGS. 3A and 3B described above).

In various embodiments, one or both of the dice and/or leads of the leadframe panel include solder bumps deposited thereon. At 406, the solder bumps are reflowed to form solder joints that physically and electrically connect the solder pad surfaces on the leads and I/O pads on the dice.

At 408 the populated leadframe or leadframe panel is flipped and subsequently positioned on a set of spacers at 410. FIG. 5 illustrates a single leadframe device area 500 having a first die 502 physically and electrically connected to leads 504 on a first side of the leadframe via a first set of solder joints 506. In the illustrated embodiment, side rails 509 of the leadframe panel are each positioned onto a spacer 508 to support the leadframe such that the dice 502 do not have to rest on any other surface.

At 412 a second die (or set of dice) 510 is positioned onto the second side of the leadframe such that I/O pads on the second die are positioned over the same leads 504 used to connect the first die. The populated leadframe 500 is then reflowed again at 414 to produce solder joints 512 that physically and electrically connect the bottom die (or dice) 510 to the second sides of the same leads 504. It should be noted that since the spacers 508 support the leadframe 500 during the second reflow the weight of the leadframe, dice and solder does not compress the first set of solder joints 506 which have been also melted during the second reflow. Additionally, it has been observed that the cohesion of the solder in the solder joints 506 is sufficient to support the hanging dice 502 during the second reflow. Subsequently, the populated leadframe panel is then encapsulated at 416 and singulated to produce individual IC packages (if necessary) at 418.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
    a first die, the first die having an active surface and a back surface substantially opposite the active surface of the first die, the active surface including a first plurality of I/O pads;
    a second die, the second die having an active surface and a back surface substantially opposite the active surface of the second die, the active surface including a second plurality of I/O pads;
    a plurality of leads that are physically separate from one another, each lead having a first surface and a second surface substantially opposite the first surface of the lead, the active surface of the first die being positioned adjacent first surfaces of leads such that I/O pads from the first plurality of I/O pads are arranged adjacent corresponding solder pad surfaces on the first surfaces of the leads, the active surface of the second die being positioned adjacent second surfaces of leads such that I/O pads from the second plurality of I/O pads are arranged adjacent corresponding solder pad surfaces on the second surfaces of the leads, the first surface of each lead including a first plurality of solder pad surfaces and a corresponding first plurality of recessed regions that isolate each of the first plurality of solder pad surfaces from other surfaces of the lead, the second surface of each lead including a second plurality of solder pad surfaces and corresponding second plurality of recessed regions that isolate each of the second plurality of solder pad surfaces from other surfaces of the lead;
    a first plurality of solder joints that are arranged to physically and electrically connect selected ones of the I/O pads from the first die to ones of the first plurality of solder pad surfaces on the first surface of each lead; and
    a second plurality of solder joints that are arranged to physically and electrically connect selected ones of the I/O pads from the second die to ones of the second plurality of solder pad surfaces on the second surface of each lead,
    wherein each of the first plurality of recessed regions on the first surface of each lead are offset from each of the second plurality of recessed regions on the second surface of the lead in a direction parallel to the first and second surfaces of the lead.

2. An integrated circuit package as recited in claim 1, further comprising a molding material that encapsulates portions of the dice, leads and solder joints.

3. An integrated circuit package as recited in claim 2, wherein the back surface of the first die is substantially uncovered by molding material and has a substantially exposed metallic layer deposited thereon.

4. An integrated circuit package as recited in claim 2, wherein the back surface of the second die is substantially uncovered by molding material and has a substantially exposed metallic layer deposited thereon.

5. An integrated circuit package as recited in claim 1, wherein at least one of the plurality of leads is a power lead that has a plurality of solder joints coupled thereto such that the power lead is electrically and physically connected to a plurality of I/O pads.

6. An integrated circuit package as recited in claim 1, wherein the first die is configured as a master die that controls operations in the second die.

7. An integrated circuit package as recited in claim 1, wherein at least one I/O pad from the first die is electrically connected with at least one I/O pad from the second die with an internal lead that does not extend outside the package.

8. An integrated circuit package as recited in claim 1, wherein at least one I/O pad from the first die is electrically connected with at least one I/O pad from the second die with a single solder joint.

9. An integrated circuit package as recited in claim 1, wherein ones of a first set of leads each include an inner lead finger portion positioned adjacent the active surface of the first die and extending substantially across the active surface of the first die.

10. An integrated circuit package as recited in claim 9, wherein the ones of the first set of leads each further include a middle lead portion and an outer lead portion that extends out from a side of the package.

11. An integrated circuit package, comprising:
    a first die, the first die having an active surface and a back surface substantially opposite the active surface of the first die, the active surface including a first plurality of I/O pads;
    a second die, the second die having an active surface and a back surface substantially opposite the active surface of the second die, the active surface including a second plurality of I/O pads;
    a plurality of leads, each lead having a first surface and a second surface substantially opposite the first surface of the lead, the active surface of the first die being positioned adjacent first surfaces of leads such that I/O pads from the first plurality of I/O pads are arranged adjacent corresponding solder pad surfaces on the first surfaces of the leads, the active surface of the second die being positioned adjacent second surfaces of leads such that I/O pads from the second plurality of I/O pads are arranged adjacent corresponding solder pad surfaces on the second surfaces of the leads; and
    a plurality of solder joints that are arranged to physically and electrically connect selected ones of the I/O pads from the first die to corresponding solder pad surfaces on the first surfaces of associated leads and to physically and electrically connect selected ones of the I/O pads from the second die to corresponding solder pad surfaces on the second surfaces of associated leads,
    wherein ones of a first set of leads each include an inner lead finger portion positioned adjacent the active surface of the first die and extending substantially across the active surface of the first die;
    wherein the ones of the first set of leads each further include a middle lead portion and an outer lead portion that extends out from a side of the package; and wherein at least some of the inner lead finger portions are arranged in interlaced adjacent rows over the active surface of the first die such that a middle and outer portion of each associated lead are positioned on an opposite side of the die as the middle and outer lead portions of the leads immediately adjacent to the associated lead.

12. An integrated circuit package as recited in claim 9, wherein each lead finger portion of a lead from the first set of leads that is intended for coupling to an external power line or an external ground line is connected with at least three I/O pads.

13. An integrated circuit package as recited in claim 10, wherein outer portions of the leads from the first set of leads are bent or downset into a gull wing formation and wherein bottom surfaces of the outer portions of the leads from the first set of leads are substantially coplanar with a bottom surface of the package.

14. An integrated circuit package as recited in claim 9, wherein each lead from the first set of leads is configured to carry at least 1 Watt.

15. An integrated circuit package as recited in claim 1, further comprising a third die, the third die having an active surface and a back surface substantially opposite the active surface of the third die, the active surface including a third plurality of I/O pads, wherein the active surface of the third die is positioned adjacent second surfaces of leads such that I/O pads from the third plurality of I/O pads are arranged adjacent corresponding solder pad surfaces on the second surfaces of the leads, and wherein a plurality of solder joints are each arranged to physically and electrically connect a selected one of the I/O pads from the third plurality of I/O pads to an associated adjacent solder pad surface.

16. An arrangement, comprising:
an integrated circuit package as recited in claim 3;
a printed circuit board, the printed circuit board including a multiplicity of contact surfaces thereon;
a plurality of solder joints that physically and electrically connect at least the exposed metallic layer on the first die and bottom surfaces of selected leads with associated contact surfaces on the printed circuit board.

17. An arrangement as recited in claim 16, wherein the back surface of the second die is substantially uncovered by molding material and has a substantially exposed metallic layer deposited thereon.

18. An arrangement as recited in claim 17, wherein a first surface of a heat sink is soldered to the metallic layer deposited on the back surface of the second die.

19. An arrangement as recited in claim 18, wherein a second surface of the heat sink is soldered to a surface of the printed circuit board.

20. An integrated circuit package, comprising:
a first die, the first die having an active surface and a back surface substantially opposite the active surface of the first die, the active surface including a first plurality of I/O pads;
a second die, the second die having an active surface and a back surface substantially opposite the active surface of the second die, the active surface including a second plurality of I/O pads;
a plurality of leads that are physically separate from one another, each lead having a first surface and a second surface substantially opposite the first surface of the lead, the active surface of the first die being positioned adjacent first surfaces of leads such that I/O pads from the first plurality of I/O pads are arranged adjacent corresponding solder pad surfaces on the first surfaces of the leads, the active surface of the second die being positioned adjacent second surfaces of leads such that I/O pads from the second plurality of I/O pads are arranged adjacent corresponding solder pad surfaces on the second surfaces of the leads, the first surface of each lead including a first plurality of solder pad surfaces and a corresponding first plurality of recessed regions that isolate each of the first plurality of solder pad surfaces from other surfaces of the lead, the second surface of each lead including a second plurality of solder pad surfaces and corresponding second plurality of recessed regions that isolate each of the second plurality of solder pad surfaces from other surfaces of the lead, wherein the plurality of leads includes a first set of leads and a second set of leads, the first set of leads crossing over a first edge of the first die, the second set of leads crossing over a second opposing edge of the first die, ones of the first set of leads and ones of the second set of leads being interlaced over the first die;
a first plurality of solder joints that are arranged to physically and electrically connect selected ones of the I/O pads from the first die to ones of the first plurality of solder pad surfaces on the first surface of each lead; and
a second plurality of solder joints that are arranged to physically and electrically connect selected ones of the I/O pads from the second die to ones of the second plurality of solder pad surfaces on the second surface of each lead.

21. The integrated circuit package of claim 20, wherein each of the first plurality of recessed regions is offset from each of the second plurality of recessed regions in a direction parallel to the first surface of the lead.

22. The integrated circuit package of claim 20, wherein:
each lead of the first and second sets of leads consists of an inner finger portion, a middle lead portion and an outer lead portion;
the inner finger portions of the first and second sets of leads are positioned adjacent the active surface of the first die and extend substantially across the active surface of the first die; and
the outer portion of one of the first set of leads has a first long axis, the inner finger and outer portions of a corresponding one of the second set of leads having a second long axis, the first and second long axes being collinear, the inner finger portion of the one of the first set of leads and the inner finger portion of the corresponding one of the second set of leads being offset in a direction perpendicular to the first long axis and arranged side-by-side in adjacent, parallel rows.

23. The integrated circuit package of claim 1, wherein the plurality of leads includes a first set of leads and a second set of leads, the first set of leads crossing over a first edge of the first die, the second set of leads crossing over a second opposing edge of the first die, ones of the first set of leads and ones of the second set of leads being interlaced and interleaved over the first die.

24. The integrated circuit package of claim 1, wherein:
the first and second dice are offset in a direction parallel to the active faces of the first and second dice; and
each of the first plurality of solder pad surfaces on the first surface of each lead is offset from
each of the second plurality of solder pad surfaces on the second surface of the lead in a direction parallel to the first and second surfaces of the lead.

* * * * *

UNITED STATES PATENT AND TRADEMARK OFFICE
Certificate

Patent No. 7,619,303 B2　　　　　　　　　　　　　　　　　　　Patented: November 17, 2009

On petition requesting issuance of a certificate for correction of inventorship pursuant to 35 U.S.C. 256, it has been found that the above identified patent, through error and without any deceptive intent, improperly sets forth the inventorship.
　　Accordingly, it is hereby certified that the correct inventorship of this patent is: Jaime A. Bayan, Palo Alto, CA (US); Will K. Wong, Belmont, CA (US); and Nghia T. Tu, San Jose, CA (US).

Signed and Sealed this Twenty-fifth Day of December 2012.

*ROBERT J. HOFFBERG*
*Supervisory Patent Examiner*
Art Unit 2891
Technology Center 2800